(12) United States Patent
Sung et al.

(10) Patent No.: US 10,497,834 B2
(45) Date of Patent: Dec. 3, 2019

(54) LIGHT-EMITTING DEVICE WITH INCREASED LIGHT OUTPUT AND REDUCED OPERATING VOLTAGE AND HAVING A THROUGH HOLE FOR AN ELECTRODE

(71) Applicant: LG INNOTEK CO., LTD., Seoul (KR)

(72) Inventors: Youn Joon Sung, Seoul (KR); Su Ik Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/740,253

(22) PCT Filed: Jun. 30, 2016

(86) PCT No.: PCT/KR2016/007009
§ 371 (c)(1),
(2) Date: Dec. 27, 2017

(87) PCT Pub. No.: WO2017/003202
PCT Pub. Date: Jan. 5, 2017

(65) Prior Publication Data
US 2018/0190870 A1    Jul. 5, 2018

(30) Foreign Application Priority Data
Jun. 30, 2015  (KR) ........................ 10-2015-0092798

(51) Int. Cl.
*H01L 33/38*     (2010.01)
*H01L 33/04*     (2010.01)
(Continued)

(52) U.S. Cl.
CPC ............ *H01L 33/382* (2013.01); *H01L 33/04* (2013.01); *H01L 33/145* (2013.01); *H01L 33/32* (2013.01);
(Continued)

(58) Field of Classification Search
None
See application file for complete search history.

(56) References Cited

U.S. PATENT DOCUMENTS

2010/0230702 A1* 9/2010 Park ........................ H01L 33/46
257/98
2010/0230703 A1* 9/2010 Jeong .................. H01L 33/0079
257/98
(Continued)

FOREIGN PATENT DOCUMENTS

KR  10-2005-0070459 A   7/2005
KR  10-2007-0022990 A   2/2007
(Continued)

*Primary Examiner* — Bilkis Jahan
(74) *Attorney, Agent, or Firm* — Birch, Stewart, Kolasch & Birch, LLP

(57) ABSTRACT

A light-emitting device according to the present invention comprises: a light-emitting structure comprising a first conductive semiconductor layer, an active layer, and a second conductive semiconductor layer; a second electrode layer coupled to the second conductive semiconductor layer at the bottom of the light-emitting structure; and a plurality of first electrode layers coupled to the first conductive semiconductor layer through penetration of the light-emitting structure at preset intervals.

15 Claims, 4 Drawing Sheets

(51) Int. Cl.
*H01L 33/14* (2010.01)
*H01L 33/32* (2010.01)
*H01L 33/40* (2010.01)
*H01L 33/44* (2010.01)
*H01L 33/62* (2010.01)
*H01L 33/64* (2010.01)
*H01L 33/22* (2010.01)

(52) U.S. Cl.
CPC ............ *H01L 33/405* (2013.01); *H01L 33/44* (2013.01); *H01L 33/62* (2013.01); *H01L 33/644* (2013.01); H01L 33/22 (2013.01); H01L 33/38 (2013.01); H01L 2933/0016 (2013.01)

(56) References Cited

U.S. PATENT DOCUMENTS

| | | | |
|---|---|---|---|
| 2011/0193123 A1 | 8/2011 | Moon et al. | |
| 2011/0272666 A1* | 11/2011 | Hung | H01L 33/22 257/13 |
| 2012/0007118 A1* | 1/2012 | Choi | H01L 33/382 257/98 |
| 2012/0056152 A1* | 3/2012 | Li | H01L 33/38 257/13 |
| 2014/0175503 A1* | 6/2014 | Hwang | H01L 33/38 257/99 |
| 2014/0219303 A1* | 8/2014 | Yang | H01L 33/382 372/44.01 |
| 2014/0231833 A1 | 8/2014 | Jeong | |
| 2015/0206922 A1* | 7/2015 | Kawai | H01L 33/08 257/91 |
| 2015/0236228 A1* | 8/2015 | Kim | H01L 33/62 348/370 |

FOREIGN PATENT DOCUMENTS

| | | |
|---|---|---|
| KR | 10-0765452 B1 | 10/2007 |
| KR | 4502691 B2 | 7/2010 |
| KR | 10-0986560 B1 | 10/2010 |
| KR | 2012-119428 A | 6/2012 |
| KR | 10-2013-0108048 A | 10/2013 |
| KR | 10-2013-0140417 A | 12/2013 |
| KR | 10-2014-0041527 A | 4/2014 |
| KR | 10-2014-0099066 A | 8/2014 |
| KR | 10-2014-0102812 A | 8/2014 |

* cited by examiner

[Figure 1]
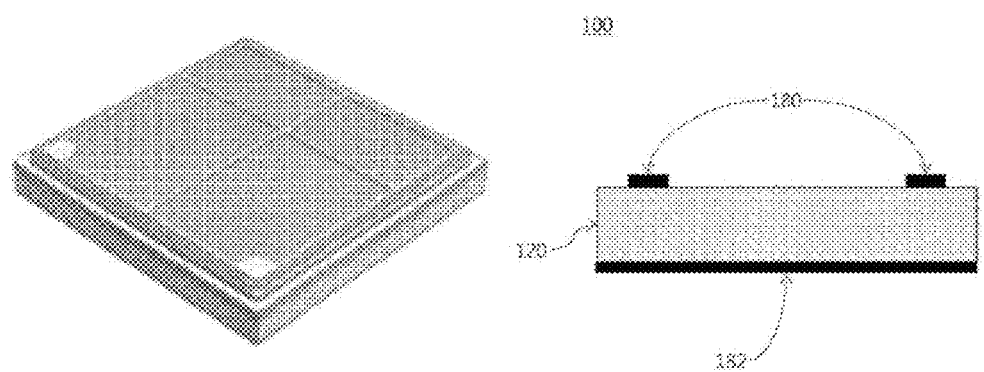
[Figure 2]
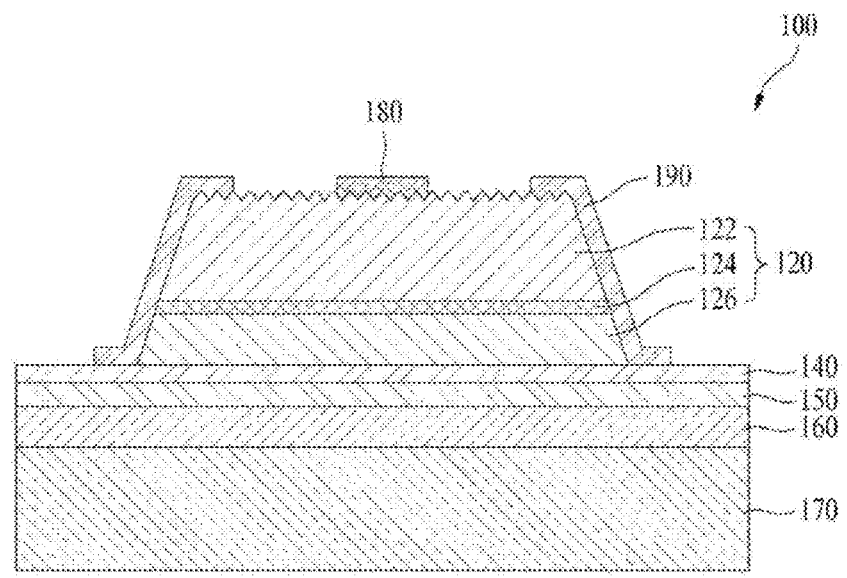

[Figure 3]
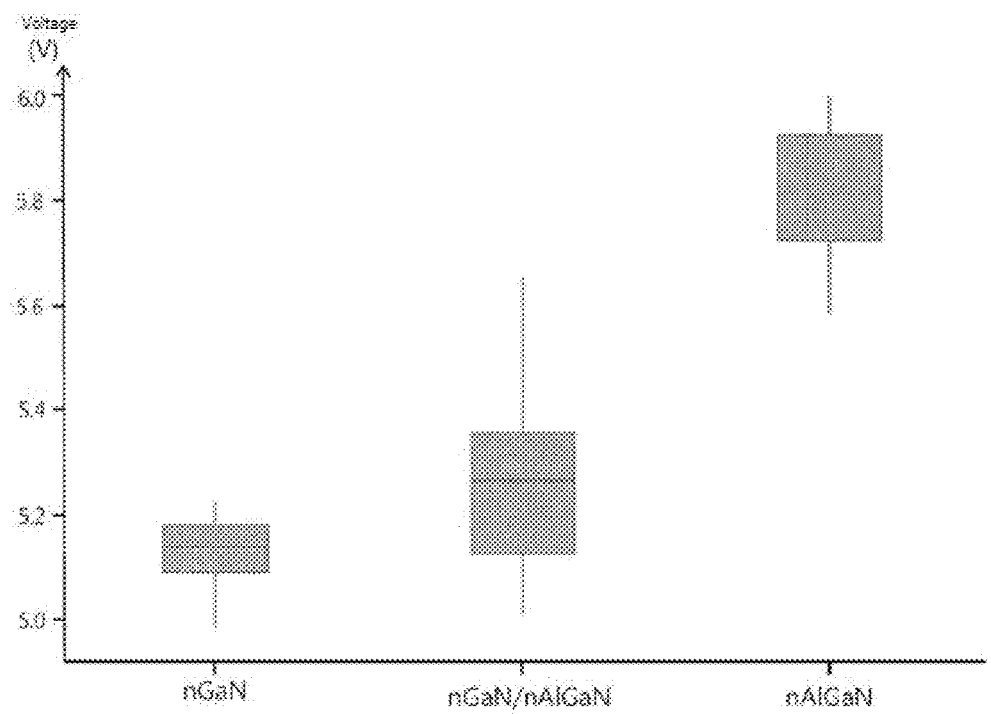
[Figure 4]
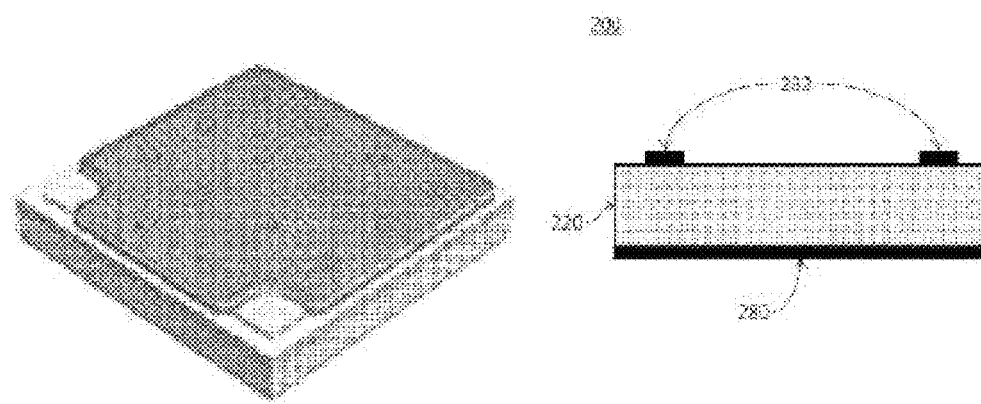

[Figure 5]
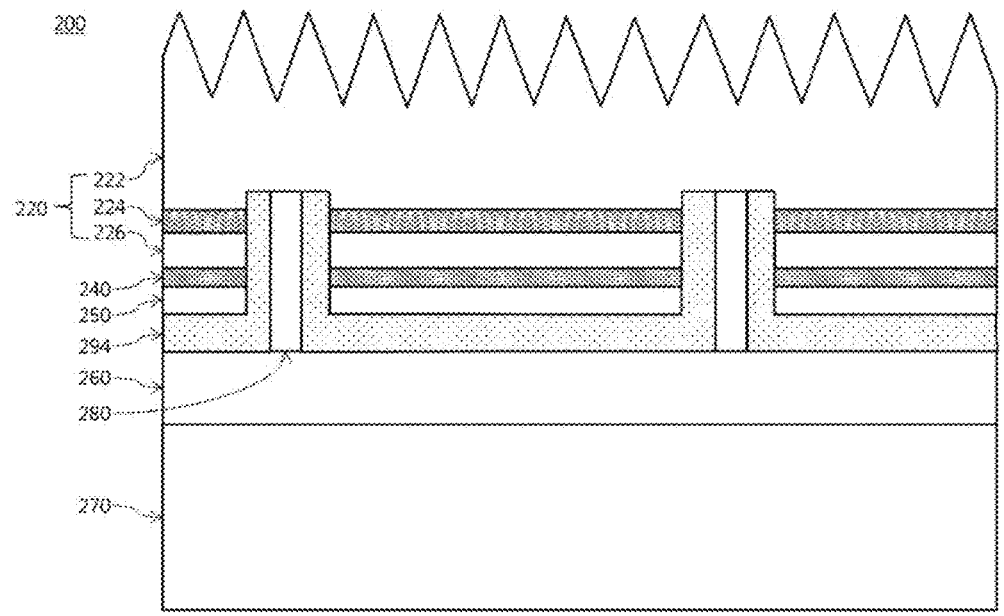
[Figure 6]
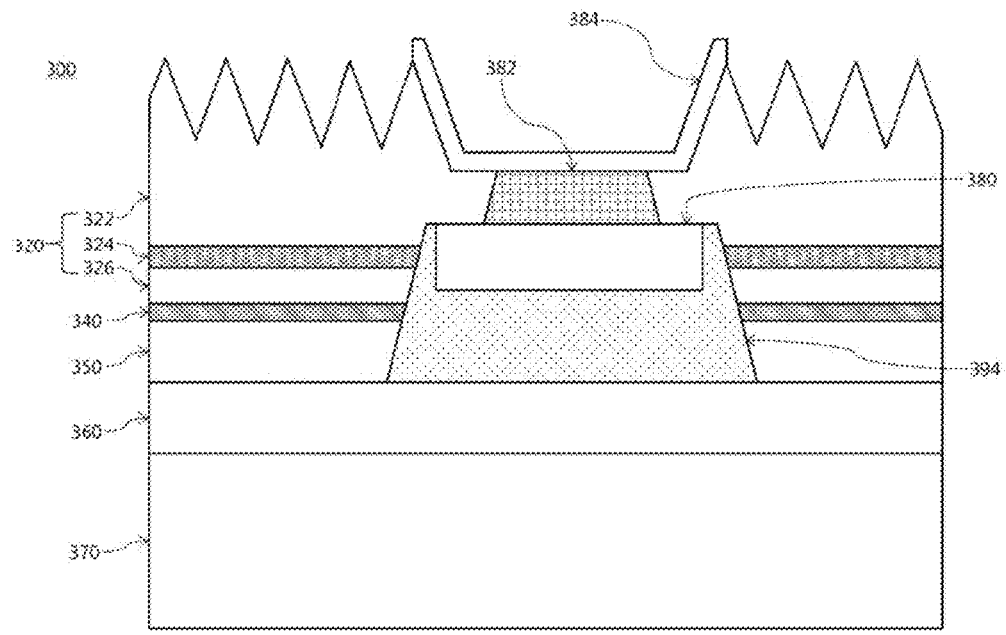

[Figure 7]
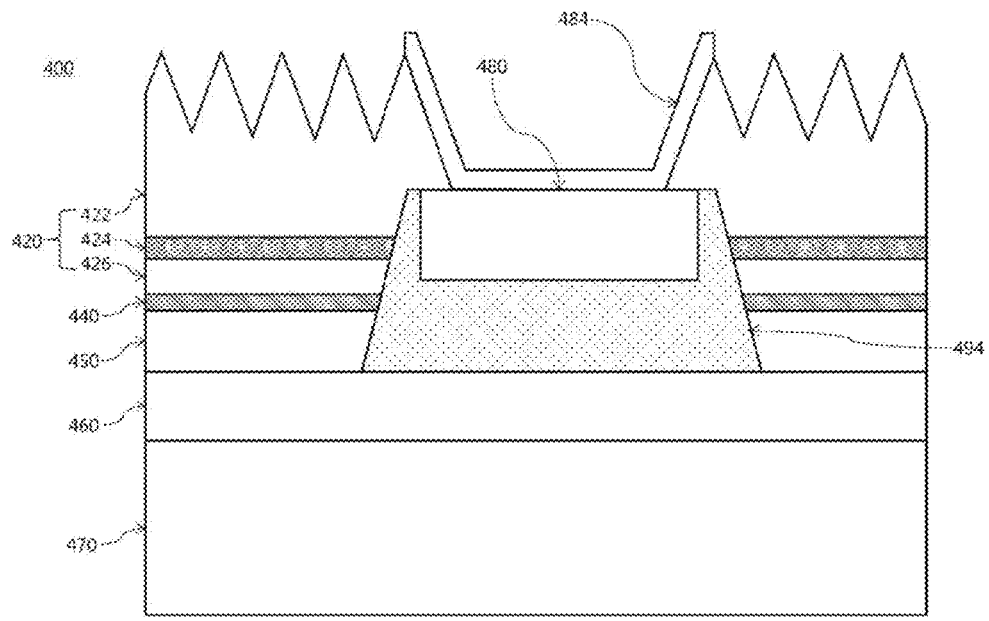
[Figure 8]
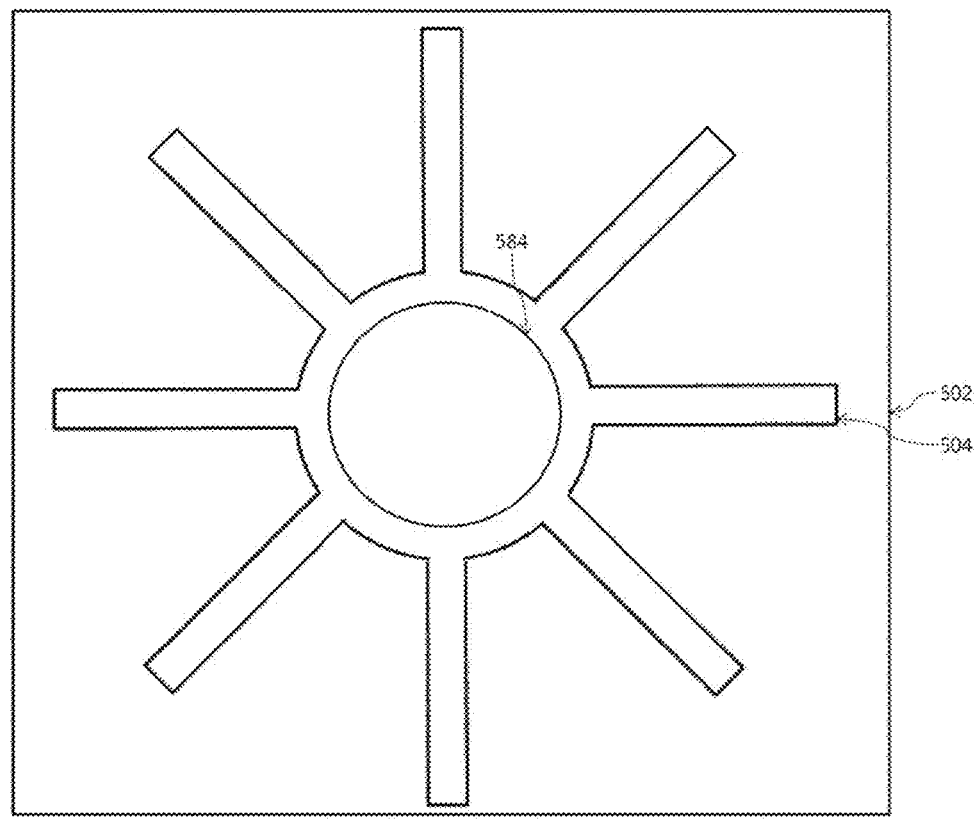

LIGHT-EMITTING DEVICE WITH INCREASED LIGHT OUTPUT AND REDUCED OPERATING VOLTAGE AND HAVING A THROUGH HOLE FOR AN ELECTRODE

CROSS REFERENCE TO RELATED APPLICATIONS

This application is the National Phase of PCT International Application No. PCT/KR2016/007009, filed on Jun. 30, 2016, which claims priority under 35 U.S.C. 119(a) to Patent Application No. 10-2015-0092798, filed in the Republic of Korea on Jun. 30, 2015, all of which are hereby expressly incorporated by reference into the present application.

TECHNICAL FIELD

The present invention relates to a structure for a light emitting device and a method for manufacturing the same. More specifically, the present invention relates to a structure for a light emitting device (LED) that can exhibit improved reliability by blocking current leakage and a method for manufacturing the same.

BACKGROUND ART

With technological development of light emitting devices (LEDs), cost reduction and energy saving are prevalent. In addition, more various devices utilizing light emitting devices (LEDs) are developed. Nowadays, although LEDs emitting visible light are actively utilized in application fields including lighting, ultraviolet (UV) light sources are widely used in scientific, agricultural, environmental and semiconductor industries and applications thereof will expand in the future.

A light emitting device (LED) is a device that converts electrical energy into light. In general, the LED includes one or more active layers including semiconductor materials interposed between a plurality of layers doped with opposite electrical properties. In general, holes and electrons are injected into the active layer when a bias is applied to two ends of the doped layers, the holes recombine with the electrons in the active layer, thus emitting light. The light is emitted from the entire surfaces of the active layer and the LED.

DISCLOSURE

Technical Problem

An object of the present invention devised to solve the problem lies in a light emitting device that has a structure to increase light output and reduce an operation voltage.

Another object of the present invention devised to solve the problem lies in a vertical light emitting device that can improve current diffusion and ohmic contact by using aluminum gallium nitride (AlGaN) for the vertical light emitting device.

Another object of the present invention devised to solve the problem lies in a structure for a vertical light emitting device that is suitable for light emitting devices emitting ultraviolet light with a wavelength of 320 nm or less.

Objects to be accomplished by the present invention are not limited to those mentioned above and other objects not disclosed herein will be clearly understood from the following description by those skilled in the art to which the present invention pertains.

Technical Solution

The object of the present invention can be achieved by providing a light emitting device including a light-emitting structure including a first conductivity-type semiconductor layer, an active layer and a second conductive semiconductor layer, a second electrode layer coupled to the second conductive semiconductor layer at the bottom of the light-emitting structure, and a plurality of first electrode layers coupled to the first conductivity-type semiconductor layer through penetration of the light-emitting structure at preset intervals.

A second ohmic contact with the second electrode may be formed on a bottom of the second conductivity-type semiconductor layer and a first ohmic contact may be formed on a surface of the first conductivity-type semiconductor layer contacting the first electrode and in the first conductivity-type semiconductor layer.

In addition, the first ohmic contact may be diffused radially based on the first electrode layer.

In addition, when the light emitting structure is formed in a predetermined area, the second electrode layer may be disposed over the entire region of the bottom of the light emitting structure and the first electrode layers may be disposed in the form of an array.

In addition, the first conductivity-type semiconductor layer may include aluminum gallium nitride (AlGaN) including an n-type conductivity-type metal.

In addition, a top surface of the first conductivity-type semiconductor layer may have a roughness.

In addition, the second electrode layer may further include a second ohmic layer for forming ohmic contact with the second conductivity-type semiconductor layer, and a reflective layer disposed under the second ohmic layer to reflect light emitted from the active layer.

In addition, the first electrode layer may include a first electrode pad exposed between the first conductivity-type semiconductor layers, a first ohmic layer disposed under the first electrode pad and connected to the first conductivity-type semiconductor layer, and an insulation layer for electrically isolating the first ohmic layer from the second electrode layer.

In addition, the first electrode layer may further include a first metal layer to connect the first electrode pad to the first ohmic layer.

In addition, the first ohmic layer may be surrounded by the insulation layer and only the top surface of the first ohmic layer may be connected to the first conductivity-type semiconductor layer.

In addition, the light emitting device may further include a support substrate disposed under the first electrode and the second electrode, and a bonding layer for bonding the first electrode and the second electrode to the support substrate.

In addition, the bonding layer may include a metal and may supply carriers to the second electrode.

In addition, the light emitting device may have a vertical structure to emit light emitted from the light emitting structure toward a top surface.

In addition, the light emitted from the light emitting structure may be ultraviolet (UV) light having a wavelength within a range of 100 to 320 nm.

In another aspect of the present invention, provided herein is a light emitting device including a light emitting structure including a first conductivity-type semiconductor layer, an active layer and a second conductivity-type semiconductor layer, a second electrode layer disposed under the light emitting structure and a first electrode layer surrounded and exposed by the light emitting structure, wherein a second ohmic contact is formed on a bottom surface of the second conductivity-type semiconductor layer, a first ohmic contact is formed in the first conductivity-type semiconductor layer and the first ohmic contact is diffused into the first conductivity-type semiconductor layer.

In addition, the first conductivity-type semiconductor layer may include aluminum gallium nitride (AlGaN) and the light emitting structure may emit ultraviolet (UV) light having a wavelength within a range of 100 to 320 nm.

In addition, the first ohmic contact may be diffused radially based on the first electrode in the first conductivity-type semiconductor layer during thermal treatment.

In addition, the second electrode layer may further include a second ohmic layer for forming ohmic contact with the second conductivity-type semiconductor layer, and a reflective layer disposed under the second ohmic layer to reflect light emitted from the active layer.

In addition, the first electrode layer may include a first electrode pad exposed between the first conductivity-type semiconductor layers, a first ohmic layer disposed under the first electrode pad and having a top surface connected to the first conductivity-type semiconductor layer, and an insulation layer for electrically isolating the first ohmic layer from the second electrode layer.

In addition, the first electrode layer may further include a first metal contact for connecting the first electrode pad to the first ohmic layer.

In addition, the light emitting device may further include a support substrate disposed under the first electrode and the second electrode, and a bonding layer for bonding the first electrode and the second electrode to the support substrate.

In another aspect of the present invention, provided herein is a light emitting device including a substrate, a first conductivity-type semiconductor layer, a second conductivity-type semiconductor layer and an active layer interposed between the first conductivity-type semiconductor layer and the second conductivity-type semiconductor layer, each disposed on the substrate, at least one recess passing through the second conductivity-type semiconductor layer and the active layer, and extending to a part of the first conductivity-type semiconductor layer, a first surface of the first conductivity-type semiconductor layer exposed in the recess, a second surface of the first conductivity-type semiconductor layer exposed outside from a top of the light emitting device, a first electrode disposed on and electrically connected to the first surface and the second surface of the first conductivity-type semiconductor layer, and a second electrode electrically connected to the second conductivity-type semiconductor layer.

In another aspect of the present invention, provided herein is a light emitting device including a substrate, a light emitting structure including a first conductivity-type semiconductor layer, an active layer and a second conductivity-type semiconductor layer disposed on the substrate, at least one recess passing through the second conductivity-type semiconductor layer and the active layer, and extending to a part of a first surface of the first conductivity-type semiconductor layer, at least one through hole passing through the second conductivity-type semiconductor layer, the active layer and the first conductivity-type semiconductor layer in the recess, a first surface of the first conductivity-type semiconductor layer exposed in the recess, a second surface of the first conductivity-type semiconductor layer exposed outside from a top of the light emitting device, a third surface of the first conductivity-type semiconductor layer exposed along a side surface of the through hole, a first electrode electrically connected to the first surface, the second surface and the third surface of the first conductivity-type semiconductor layer, and a second electrode electrically connected to the second conductivity-type semiconductor layer.

The aspects of the present invention are only some of preferred embodiments of the present invention and various embodiments which reflect technical features of the present invention can be conceived and understood based on the Detailed Description of the Invention by those skilled in the art to which the present invention pertains.

Advantageous Effects

The effects of the device according to the present invention will be described as follows.

The present invention can enhance operation features by improving the structure of an ultraviolet light emitting device.

In addition, the present invention can improve light output of a light emitting device using aluminum gallium nitride (AlGaN) and reduce operation voltage thereof.

Effects which can be achieved by the present invention are not limited to those described above and other effects can be clearly understood from the following description by those skilled in the art to which the present invention pertains.

DESCRIPTION OF DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 1 illustrates a first structure of a vertical light emitting device;

FIG. 2 illustrates the light emitting device of FIG. 1;

FIG. 3 illustrates operation features of the light emitting device shown in FIG. 1 depending on materials contained in the light emitting device;

FIG. 4 illustrates a second structure of a vertical light emitting device;

FIG. 5 illustrates the light emitting device shown in FIG. 4;

FIG. 6 illustrates a third structure of a vertical light emitting device;

FIG. 7 illustrates a fourth structure of a vertical light emitting device; and FIG. 8 illustrates ohmic contact of the vertical light emitting device shown in FIG. 6 or 7.

BEST MODE

Hereinafter, devices to which the embodiments of the present invention are applied and various methods will be described in more detail with reference to the annexed drawings.

In the description of embodiments, it will be understood that, when one element is referred to as being "on (above)" or "under (below)" another element, one element may directly contact the other element, or one or more intervening elements may also be present between the two elements.

In addition, "on (above)" or "under (below)" may include upward and downward directions, based on any element.

In the drawings, the sizes and thicknesses of respective layers are exaggerated, omitted or schematically illustrated for convenience of description and clarity of the present invention. In addition, the sizes of respective elements do not entirely reflect actual sizes thereof.

FIG. 1 illustrates a first structure of a vertical light emitting device 100.

As shown in the drawing, the light emitting device 100 includes a first electrode 180 formed on a light emitting structure 120 and a second electrode 182 formed under the light emitting structure 120. A support substrate is connected to the bottom of the light emitting structure 120 through a metal structure, thus providing a structure advantageous for heat emission. However, diffusion of electrons that the first electrode 180 injects is inevitably limited, such that there is a limitation of low light output of the light emitting device 100.

FIG. 2 illustrates the light emitting device 100 of FIG. 1.

As shown in the drawing, the light emitting structure 120 includes a first conductivity-type semiconductor layer 122, an active layer 124 and a second conductivity-type semiconductor layer 126.

An electron blocking layer (not shown) may be disposed between the active layer 124 and the second conductivity-type semiconductor layer 126. The electron blocking layer may have a superlattice structure wherein the superlattice is, for example, formed by disposing AlGaN doped with a second conductivity-type dopant, or alternately disposing a plurality of GaN layers with different aluminium composition ratios.

The surface of the first conductivity-type semiconductor layer 122 creates a certain pattern, thus improving light extraction efficiency. A first electrode 180 is disposed on the surface of the first conductivity-type semiconductor layer 122 and the surface of the first conductivity-type semiconductor layer 122 on which the first electrode 180 is disposed may not create a pattern, although not shown. The first electrode 180 may be formed with a monolayer or multilayer structure including at least one of aluminum (Al), titanium (Ti), chromium (Cr), nickel (Ni), copper (Cu) and gold (Au).

The second electrode 182 (see FIG. 1) should be disposed under the light emitting structure 120 and an ohmic layer 140 and a reflective layer 150 may serve as the second electrode. GaN is disposed under the second conductivity-type semiconductor layer 126, which promotes supply of current or holes to the second conductivity-type semiconductor layer 126.

The ohmic layer 140 may have a thickness of about 200 Angstrom (Å). The ohmic layer 140 may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, or Hf, but the present invention is not limited to these materials.

The reflective layer 150 may be a metal layer including molybdenum (Mo), aluminum (Al), silver (Ag), nickel (Ni), platinum (Pt), or rhodium (Rh), or an alloy including Al, Ag, Pt or Rh. The aluminum, silver or the like effectively reflects light emitted from the active layer 124, thus improving light extraction efficiency of semiconductor devices. Molybdenum is advantageous for plating growth of protrusion parts.

The support substrate 170 may be formed using a conductive material such as a metal or a semiconductor material. The support substrate 170 may be formed using a metal with superior electrical conductivity or thermal conductivity, or a material with excellent thermal conductivity such as a metal since heat generated during operation of semiconductor devices should be sufficiently radiated. The support substrate 170, for example, includes a material selected from the group consisting of molybdenum (Mo), silicon (Si), tungsten (W), copper (Cu) and aluminum (Al) or an alloy thereof, and optionally includes gold (Au), copper alloy, nickel (Ni), copper-tungsten (Cu—W), a carrier wafer (for example, GaN, Si, Ge, GaAs, ZnO, SiGe, SiC, SiGe, $Ga_2O_3$ or the like) or the like.

The support substrate 170 may have a thickness of 50 to 200 micrometers in order to provide mechanical strength to some extent to efficiently divide into separate chips by scribing and breaking processes without causing warpage to the entire nitride semiconductor.

A bonding layer 160 bonds the reflective layer 150 to the support substrate 170 and is formed using a material selected from the group consisting of gold (Au), tin (Sn), indium (In), aluminum (Al), silicon (Si), silver (Ag), nickel (Ni) and copper (Cu), or an alloy thereof.

A passivation layer 190 may be formed in at least a part of a side surface and a lower surface of the light emitting structure 120. The passivation layer 190 can protect the light emitting structure and prevent interlayer electrical short. The passivation layer 190 may include an insulating material such as an oxide or nitride, for example, a silicon oxide ($SiO_2$) layer, an oxynitride layer or an aluminum oxide layer.

In order to improve operation properties of the light emitting device 100 having a first structure, it is necessary to bring an n-type electrode (for example, first electrode, 180) into ohmic-contact with a first conductivity-type semiconductor layer including aluminium gallium nitride (nAlGaN) including a first conductivity-type material. However, operation voltage is inevitably increased because it is impossible to conduct thermal treatment after formation of the first electrode 180 during the overall process. In particular, the first structure with an increased operation voltage is inapplicable to light emitting devices which emit ultraviolet light with a short wavelength of 300 nm or less (for example, 100 to 280 nm, ultraviolet C, UVC).

FIG. 3 illustrates operation features of the light emitting device 100 shown in FIG. 1 depending on a material contained in the light emitting device 100.

As shown in the drawing, operation voltage is changed depending on the material contained in the first conductivity-type semiconductor layer 122 (see FIG. 2) connected to the first electrode 180. This is due to the fact that the first electrode 180 and the first conductivity-type semiconductor layer 122 are formed of different materials, changing electrical properties in the bonding area.

For example, when the first conductivity-type semiconductor layer 122 contains gallium nitride (nGaN), operation voltage is in the range of 5.0V to 5.2V. On the other hand, when the first conductivity-type semiconductor layer 122 includes gallium nitride (nGaN) and aluminum gallium nitride (nAlGaN), the operation voltage is the range of 5.0V to 5.4V, which is slightly higher than when the first conductivity-type semiconductor layer 122 includes only gallium nitride (nGaN). In addition, when the first conductivity-type semiconductor layer 122 includes aluminium gallium nitride (nAlGaN), the operation voltage is in the range of 5.6V to 6.0V which is higher than when the first conductivity-type semiconductor layer 122 includes gallium nitride (nGaN).

When the light emitting structure of the light emitting device emits ultraviolet light, aluminium gallium nitride (nAlGaN) is used for the first conductivity-type semiconductor layer 122. The light emitting device having the first structure may have an increased operation voltage and thus decreased light output efficiency.

FIG. 4 illustrates a second structure of a vertical light emitting device 200.

As shown in the drawing, the light emitting device 200 includes a second electrode 282 exposed to the top of the light emitting structure 220 and a first electrode 280 formed under the light emitting structure 220. Since electrons can be injected through the bottom of the light emitting structure 120 of the second structure, the light emitting structure 120 can exhibit better light output than the light emitting device 100 (see FIG. 1) with the first structure. However, there are drawbacks in that the process for manufacturing the light emitting device 200 is complicated and lengthened.

FIG. 5 illustrates the light emitting device 200 shown in FIG. 4.

As shown in the drawing, a light emitting structure 220 includes a first conductivity-type semiconductor layer 222, an active layer 224 and a second conductivity-type semiconductor layer 226.

An electron blocking layer (not shown) may be disposed between the active layer 224 and the second conductivity-type semiconductor layer 226. The electron blocking layer may have a superlattice structure, wherein the superlattice is, for example, formed by disposing AlGaN doped with a second conductivity-type dopant, or alternately disposing a plurality of GaN layers with different aluminium composition ratios.

The surface of the first conductivity-type semiconductor layer 222 creates a certain pattern, thus improving light extraction efficiency and the first conductivity-type semiconductor layer 222 is connected to the first electrode 280. The first electrode 280 may be connected to the bonding layer 260 and the first electrode 280 may be formed with a monolayer or multilayer structure including at least one of aluminum (Al), titanium (Ti), chromium (Cr), nickel (Ni), copper (Cu) or gold (Au).

An ohmic layer 240 and a reflective layer 250 connected to the second electrode 282 (see FIG. 4) may serve as the second electrode. GaN is disposed under the second conductivity-type semiconductor layer 226, which promotes supply of current or holes to the second conductivity-type semiconductor layer 226.

The ohmic layer 240 may have a thickness of about 200 Angstrom (Å). The ohmic layer 240 may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, or Hf, but the present invention is not limited to these materials.

The reflective layer 250 may be a metal layer including molybdenum (Mo), aluminum (Al), silver (Ag), nickel (Ni), platinum (Pt), or rhodium (Rh), or an alloy including Al, Ag, Pt or Rh. The aluminum, silver or the like effectively reflects light emitted from the active layer 224, thus improving light extraction efficiency of semiconductor devices. Molybdenum is advantageous for plating growth of protrusion parts.

The support substrate 270 may be formed using a conductive material such as a metal or semiconductor material. The support substrate 270 may be formed using a metal with superior electrical conductivity or thermal conductivity, or a material with excellent thermal conductivity such as a metal since heat generated during operation of semiconductor devices should be sufficiently dissipated. The support substrate 270 includes, for example, a material selected from the group consisting of molybdenum (Mo), silicon (Si), tungsten (W), copper (Cu) and aluminum (Al) or an alloy thereof, and optionally includes gold (Au), copper alloy, nickel (Ni), copper-tungsten (Cu—W), a carrier wafer (for example, GaN, Si, Ge, GaAs, ZnO, SiGe, SiC, SiGe, $Ga_2O_3$ or the like) or the like.

The support substrate 270 may have a thickness of 50 to 200 micrometers in order to provide mechanical strength to some extent to efficiently divide into separate chips by scribing and breaking processes without causing warpage to the entire nitride semiconductor.

The first electrode 280 may be electrically isolated from the ohmic layer 240 and the reflective layer 250 that serve as the second electrode by an insulation film 294.

For example, in order to connect the first conductivity-type semiconductor layer 222 to the first electrode 280, a hole which passes through the active layer 224 and the second conductivity-type semiconductor layer 226 in the light emitting structure 220 or a recess that exposes the first conductivity-type semiconductor layer 222 in the light emitting structure 220 is formed, and an insulation film 294 is then formed on the inner wall of the recess such that the active layer 224 and the second conductivity-type semiconductor layer 226 are electrically isolated from the first electrode 280. At this time, the insulation film 294 exposes the first conductivity-type semiconductor layer 222. The first electrode 280 can be formed by embedding a conductor constituting the first electrode 280 such that the first electrode 280 is connected to the first conductivity-type semiconductor layer 222 exposed by the through hole or recess.

The bonding layer 260 bonds the insulation film 294 to the support substrate 270 and is formed using a material selected from the group consisting of gold (Au), tin (Sn), indium (In), aluminum (Al), silicon (Si), silver (Ag), nickel (Ni) and copper (Cu), or an alloy thereof. The bonding layer 260 is connected to the first electrode 280 and supplies electrons to the first conductivity-type semiconductor layer 222.

The light emitting device 200 having a second structure has poorer carrier diffusion through a p-type electrode (for example, second electrode) than the light emitting device 100 having a first structure. The reason for this is that the light emitting device 200 of the second structure utilizes the bonding layer 260 as an n-type electrode (for example, first electrode) to supply electrons to the light emitting structure 120, while the light emitting device 100 of the first structure utilizes the bonding layer 160 as a p-type electrode (for example, second electrode) to supply holes to the entire surface of the bottom of the light emitting structure 120. Carriers (for example, holes) move through thin films of the ohmic layer 240 and the reflective layer 250 used as the p-type electrode (for example, second electrode) in the light emitting device 200, thus causing an increase in resistance. The increase in resistance may make it difficult to entirely diffuse holes into the light emitting structure 220. In particular, when the light emitting structure 220 emits ultraviolet light, it is more advantageous to inject carriers into the entire surface through the p-type electrode (for example, second electrode).

FIG. 6 illustrates a third structure of a vertical light emitting device 300.

As shown in the drawing, the light emitting structure 320 includes a first conductivity-type semiconductor layer 322, an active layer 324 and a second conductivity-type semiconductor layer 326.

An electron blocking layer (not shown) may be disposed between the active layer 324 and the second conductivity-type semiconductor layer 326. The electron blocking layer may have a superlattice structure, wherein the superlattice is, for example, formed by disposing AlGaN doped with a second conductivity-type dopant, or alternately disposing a plurality of GaN layers with different aluminium composition ratios.

The surface of the first conductivity-type semiconductor layer 322 creates a certain pattern, thus improving light extraction efficiency and the first conductivity-type semiconductor layer 322 is connected to the first electrode 380.

An ohmic layer 340 and a reflective layer 350 connected to the second electrode 282 (see FIG. 4) may serve as the second electrode under the light emitting structure 320. GaN is disposed under the second conductivity-type semiconductor layer 326, which promotes supply of current or holes to the second conductivity-type semiconductor layer 326.

The ohmic layer 340 may have a thickness of about 200 Angstrom (Å). The ohmic layer 340 may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, or Hf, but the present invention is not limited to these materials.

The reflective layer 350 may be a metal layer including molybdenum (Mo), aluminum (Al), silver (Ag), nickel (Ni), platinum (Pt), or rhodium (Rh), or an alloy including Al, Ag, Pt or Rh. The aluminum, silver or like effectively reflects light emitted from the active layer 324, thus improving light extraction efficiency of semiconductor devices. Molybdenum is advantageous for plating growth of protrusion parts.

A first electrode contact 380, a first electrode 382 and a first electrode pad 384 for supplying carriers (for example, electrons) to the first conductivity-type semiconductor layer 322 pass through the light emitting structure 320. The first electrode contact 380 and the first electrode 382 may be formed in the form of a mono- or multilayer structure including at least one of aluminum (Al), titanium (Ti), chromium (Cr), nickel (Ni), copper (Cu) or gold (Au). The first electrode pad 384 may include a metal such as aluminum (Al), titanium (Ti), chromium (Cr), nickel (Ni), copper (Cu), gold (Au) or tin (Sn).

The insulation film 394 surrounding the first electrode contact 380 functions to electrically isolate the first electrode contact 380 from the active layer 324 and the second conductivity-type semiconductor layer 326 of the light emitting structure 320. In this case, since the ohmic layer 340 and the reflective layer 350 serve as the second electrode, the insulation film 394 electrically also isolates the ohmic layer 340 and the reflective layer 350 from the first electrode contact 380.

The support substrate 370 may be formed using a conductive material such as a metal or semiconductor material.

The support substrate 370 may be formed using a metal with superior electrical conductivity or thermal conductivity, or a material with excellent thermal conductivity such as a metal since heat generated during operation of semiconductor devices should be sufficiently dissipated. The support substrate 370 includes, for example, a material selected from the group consisting of molybdenum (Mo), silicon (Si), tungsten (W), copper (Cu) and aluminum (Al), or an alloy thereof, and optionally includes gold (Au), copper alloy, nickel (Ni), copper-tungsten (Cu—W), a carrier wafer (for example, GaN, Si, Ge, GaAs, ZnO, SiGe, SiC, SiGe, Ga$_2$O$_3$ or the like) or the like.

The support substrate 370 may have a thickness of 50 to 200 micrometers in order to provide mechanical strength to some extent to efficiently divide into separate chips by scribing and breaking processes without causing warpage to the entire nitride semiconductor.

The insulation film 394 electrically isolates the first electrode contact 380 and the first electrode 382 from the ohmic layer 340 and the reflective layer 350 serving as the second electrode.

A bonding layer 360 bonds the reflective layer 350 and the insulation film 394 to the support substrate 370, and is formed using a material selected from the group consisting of gold (Au), tin (Sn), indium (In), aluminum (Al), silicon (Si), silver (Ag), nickel (Ni) and copper (Cu), or an alloy thereof. The bonding layer 360 is electrically connected to the reflective layer 350 and thus supplies carriers (for example holes) to the second conductivity-type semiconductor layer 326. Although the bonding layer 360 transfers carriers to the second conductivity-type semiconductor layer 326, it is isolated with the first electrode 380 via the insulation film 394, preventing electric short during operation of the light emitting device 300. For this purpose, the insulation film 394 may have a thickness of 7,000 nm or more.

FIG. 7 illustrates a fourth structure of a vertical light emitting device 400.

As shown in the drawing, the light emitting structure 420 includes a first conductivity-type semiconductor layer 422, an active layer 424 and a second conductivity-type semiconductor layer 426.

An electron blocking layer (not shown) may be disposed between the active layer 424 and the second conductivity-type semiconductor layer 426. The electron blocking layer may have a superlattice structure, wherein the superlattice is for example formed by disposing AlGaN doped with a second conductivity-type dopant, or alternately disposing a plurality of GaN layers with different aluminium composition ratios.

The surface of the first conductivity-type semiconductor layer 422 creates a certain pattern, thus improving light extraction efficiency and the first conductivity-type semiconductor layer 422 is connected to the first electrode 480.

An ohmic layer 440 and a reflective layer 450 connected to the second electrode 282 (see FIG. 4) under the light emitting structure 420 may serve as the second electrode. GaN is disposed under the second conductivity-type semiconductor layer 426, which promotes supply of current or holes to the second conductivity-type semiconductor layer 426.

The ohmic layer 440 may have a thickness of about 200 Angstrom (Å). The ohmic layer 440 may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, and Ni/IrOx/Au/ITO, Ag, Ni, Cr, Ti, Al, Rh, Pd, Ir, Sn, In, Ru, Mg, Zn, Pt, Au, or Hf, but the present invention is not limited to these materials.

The reflective layer 450 may be a metal layer including molybdenum (Mo), aluminum (Al), silver (Ag), nickel (Ni), platinum (Pt), or rhodium (Rh), or an alloy including Al, Ag, Pt or Rh. The aluminum, silver or the like effectively reflects light emitted from the active layer 424, thus improving light extraction efficiency of semiconductor devices. Molybdenum is advantageous for plating growth of protrusion parts.

A first electrode 480 and a first electrode pad 484 for supplying carriers (for example, electrons) to the first conductivity-type semiconductor layer 422 pass through the light emitting structure 420. The first electrode 480 and the first electrode contact 482 may be formed in the form of a monolayer or multilayer structure including at least one of aluminum (Al), titanium (Ti), chromium (Cr), nickel (Ni), copper (Cu) or gold (Au). The first electrode pad 484 may include a metal such as aluminum (Al), titanium (Ti), chromium (Cr), nickel (Ni), copper (Cu), gold (Au), or tin (Sn).

The insulation film 494 surrounding the first electrode 480 functions to electrically isolate the first electrode 480 from the active layer 424 and the second conductivity-type semiconductor layer 426 of the light emitting structure 420. In this case, since the ohmic layer 440 and the reflective layer 450 serve as the second electrode, the insulation film 494 electrically isolates the ohmic layer 440 and the reflective layer 450 from the first electrode 480 as well.

The support substrate 470 may be formed using a conductive material such as a metal or semiconductor material. The support substrate 470 may be formed using a metal with superior electrical conductivity or thermal conductivity, or a material with excellent thermal conductivity such as a metal since heat generated during operation of semiconductor devices should be sufficiently dissipated. The support substrate 470 includes, for example, a material selected from the group consisting of molybdenum (Mo), silicon (Si), tungsten (W), copper (Cu) and aluminum (Al), or an alloy thereof, and optionally includes gold (Au), copper alloy, nickel (Ni), copper-tungsten (Cu—W), a carrier wafer (for example, GaN, Si, Ge, GaAs, ZnO, SiGe, SiC, SiGe, $Ga_2O_3$ or the like) or the like.

The support substrate 470 may have a thickness of 50 to 200 micrometers in order to provide mechanical strength to some extent to efficiently divide into separate chips by scribing and breaking processes without causing warpage of the entire nitride semiconductor.

The first electrode 480 is electrically isolated from the ohmic layer 440 and the reflective layer 450 serving as the second electrode via the insulation film 494.

A bonding layer 460 bonds the reflective layer 450 and the insulation film 494 to the support substrate 470 and is formed using a material selected from the group consisting of gold (Au), tin (Sn), indium (In), aluminum (Al), silicon (Si), silver (Ag), nickel (Ni) and copper (Cu), or an alloy thereof. The bonding layer 460 is electrically connected to the reflective layer 450 and thus supplies carriers (for example, holes) to the second conductivity-type semiconductor layer 426. Although the bonding layer 460 transfers carriers to the second conductivity-type semiconductor layer 426, it is isolated from the first electrode 480 via the insulation film 494, preventing electric short during operation of the light emitting device 400. For this purpose, the insulation film 494 may have a thickness of 7000 nm or more.

FIG. 8 illustrates ohmic contact of the vertical light emitting device shown in FIG. 6 or 7.

As shown in the drawing, the vertical light emitting device having the third structure or the fourth structure may include a second ohmic contact 502 over the entire area thereof and a first ohmic contact 504 having a structure diffused radially based on a first electrode 584.

The second ohmic contact 502 is formed under the light emitting structure 320 or 420 and may be a p-type ohmic contact. In addition, the first ohmic contact 504 may be an n-type ohmic contact which is formed by diffusion through a thermal treatment process in the first conductivity-type semiconductor layer 322 or 422. The first ohmic contact 504 may be radially diffused based on the first electrode 584, but its shape and area may be changed according to manufacturing process.

In an embodiment of the present invention, light emitted from the light emitting structure in the light emitting device may be medium or short wavelength ultraviolet light (ultraviolet B (UVB) or ultraviolet C (UVC)) having a wavelength within a range of about 100 to about 320 nm. The ultraviolet LED may be applied to devices having a bactericidal function. For example, devices for household and industrial sites having a bactericidal function such as an air purifier, a humidifier and a water purifier may include ultraviolet LEDs.

The features, structures and effects with reference to the embodiments described above are incorporated in at least one embodiment of the present invention and are not necessarily limited to the at least one embodiment. Furthermore, features, structures and effects exemplified in the embodiments can be implemented in other embodiments through combination and modification by those skilled in the art to which the present invention pertains. Accordingly, it should be understood that such combination and modification fall within the scope of the present invention.

Meanwhile, although embodiments have been disclosed, they are provided only for illustrative purposes and should not be construed as limiting the scope of the present invention. It will be apparent to those skilled in the art that various modifications and variations can be made in the present invention without departing from the spirit or scope of the invention. For example, respective constituent components described in embodiments can be modified for implementation. Furthermore, differences related to such modifications and applications should be construed as falling within the scope of the present invention defined by the claims attached herein.

The invention claimed is:

1. A light emitting device comprising:
   a light emitting structure including:
   a first surface and a second surface opposite to the first surface,
   a first conductivity-type semiconductor layer adjacent to the first surface,
   a second conductivity-type semiconductor layer adjacent to the second surface,
   an active layer interposed between the first conductivity-type semiconductor layer and the second conductivity-type semiconductor layer, and
   at least one recess passing through the second conductivity-type semiconductor layer, the active layer, and a portion of the first conductivity-type semiconductor layer;

a first electrode electrically connected to the first conductivity-type semiconductor layer; and
a second electrode electrically connected to the second conductivity-type semiconductor layer,
wherein the first electrode includes a first portion and a second portion,
wherein the first portion disposed in the at least one recess contacts the first conductivity-type semiconductor layer,
wherein the second portion connected to the first portion passes through the first conductivity-type semiconductor layer,
wherein the first surface includes a roughness, and
wherein the second portion contacts the roughness of the first surface.

2. The light emitting device according to claim 1, wherein a second ohmic contact directly contacts the second conductivity-type semiconductor layer and a first ohmic contact directly contacts the first conductivity-type semiconductor layer in the at least one recess.

3. The light emitting device according to claim 1, wherein the first electrode includes a plurality of radial extension portions spaced apart from each other based on the first electrode.

4. The light emitting device according to claim 1,
wherein the light emitting structure comprises a III-N semiconductor,
wherein the first surface includes an N-polar surface, and
wherein the second surface includes a Ga-polar surface.

5. The light emitting device according to claim 4,
wherein the first portion contacts the Ga-polar surface, and
wherein the second portion contacts the N-polar surface.

6. The light emitting device according to claim 1,
wherein the first electrode includes a connection portion, and
wherein the connection portion is disposed between the first portion and the second portion.

7. The light emitting device according to claim 6, wherein the first portion is surrounded by an insulation layer and only a top surface of the first portion is connected to the first conductivity-type semiconductor layer.

8. The light emitting device according to claim 1, further comprising:
a support substrate disposed under the first electrode and the second electrode; and
a bonding layer for bonding the first electrode and the second electrode to the support substrate.

9. The light emitting device according to claim 1, wherein the light emitted from the light emitting structure is ultraviolet (UV) light having a wavelength within a range of 100 to 320 nm.

10. A light emitting device comprising:
a light emitting structure including:
a first conductivity-type semiconductor layer,
a second conductivity-type semiconductor layer,
an active layer interposed between the first conductivity-type semiconductor layer and the second conductivity-type semiconductor layer,
at least one recess passing through the second conductivity-type semiconductor layer, the active layer, and a portion of the first conductivity-type semiconductor layer, and
at least one through hole in the at least one recess passing through the first conductivity-type semiconductor layer;
a first electrode disposed in the at least one recess and electrically connected to the first conductivity-type semiconductor layer;
a first electrode pad electrically connected to the first electrode; and
a second electrode electrically connected to the second conductivity-type semiconductor layer,
wherein the first electrode pad includes a pad portion and an extending portion,
wherein the pad portion is disposed on the at least one through hole,
wherein the extending portion is disposed in the at least one through hole extending to the first electrode from the pad portion,
wherein the first electrode, the pad portion, and the extending portion are electrically connected each other,
wherein the pad portion is disposed on an upper surface of the light emitting structure,
wherein the pad portion of the first electrode and the second electrode are disposed on opposite sides of the light emitting structure, and
wherein the pad portion is disposed on an uppermost surface of the first conductivity-type semiconductor layer and the first electrode is disposed on a lower surface of the first conductivity-type semiconductor opposite to the uppermost surface of the first conductivity-type semiconductor layer, and at least a portion of the first conductivity-type semiconductor layer is between the pad portion and the first electrode.

11. The light emitting device according to claim 10, wherein the first conductivity-type semiconductor layer comprises aluminum gallium nitride (AlGaN) and the light emitting structure emits ultraviolet (UV) light having a wavelength within a range of 100 to 320 nm.

12. The light emitting device according to claim 10, wherein the second electrode further comprises:
a second ohmic layer for forming an ohmic contact with the second conductivity-type semiconductor layer; and
a reflective layer disposed under the second ohmic layer to reflect light emitted from the active layer.

13. The light emitting device according to claim 10, wherein the first electrode pad is exposed between portions of the first conductivity-type semiconductor layer,
wherein the first electrode includes a first ohmic layer disposed under the first electrode pad and having a top surface connected to the first conductivity-type semiconductor layer, and
wherein the first electrode layer further comprises a first metal contact for connecting the first electrode pad to the first ohmic layer.

14. The light emitting device according to claim 10, further comprising:
a support substrate disposed under the first electrode and the second electrode; and
a bonding layer for bonding the first electrode and the second electrode to the support substrate.

15. The light emitting device according to claim 10, further comprising:
a first ohmic layer disposed under the first electrode pad; and
a first metal layer disposed between the first electrode and the first electrode pad for electrically connecting to the first ohmic layer.

* * * * *